(12) United States Patent
Dono et al.

(10) Patent No.: US 8,254,153 B2
(45) Date of Patent: Aug. 28, 2012

(54) SEMICONDUCTOR MEMORY DEVICE HAVING PAD ELECTRODES ARRANGED IN PLURAL ROWS

(75) Inventors: Chiaki Dono, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 58 days.

(21) Appl. No.: 12/923,168

(22) Filed: Sep. 7, 2010

(65) Prior Publication Data

US 2011/0058401 A1    Mar. 10, 2011

(30) Foreign Application Priority Data

Sep. 8, 2009    (JP) ................................ 2009-207400

(51) Int. Cl.
*G11C 5/06* (2006.01)

(52) U.S. Cl. .. 365/63; 365/230.03; 365/51; 365/189.08; 365/189.02

(58) Field of Classification Search .................... 365/63, 365/230.03, 233, 51, 189.08, 189.02
See application file for complete search history.

(56) References Cited

U.S. PATENT DOCUMENTS

| | | | | |
|---|---|---|---|---|
| 6,147,924 A | * | 11/2000 | Lee et al. | 365/230.03 |
| 6,150,728 A | * | 11/2000 | Tsukude et al. | 257/786 |
| 6,625,050 B2 | * | 9/2003 | Suwa et al. | 365/63 |
| 6,975,020 B2 | * | 12/2005 | Lee | 257/666 |
| 7,359,252 B2 | * | 4/2008 | Suh | 365/189.02 |
| 7,391,113 B2 | | 6/2008 | Isa et al. | |

FOREIGN PATENT DOCUMENTS

JP    2006-278805    10/2006

* cited by examiner

*Primary Examiner* — Connie Yoha
(74) *Attorney, Agent, or Firm* — McGinn IP Law Group, PLLC (57) ABSTRACT

To include a first memory cell array area and a second memory cell array area, a peripheral circuit area arranged between these memory cell array areas, a first pad row arranged between the first memory cell array area and the peripheral circuit area, and a second pad row arranged between the second memory cell array area and the peripheral circuit area. No peripheral circuit is arranged substantially between the first memory cell array area and the first pad row as well as between the second memory cell array area and the second pad row. With this arrangement, a memory cell array area and a predetermined pad can be connected within a shorter distance by using a wiring formed in an upper layer that has a lower electrical resistance, and a power potential can be stably supplied to the memory cell array area.

20 Claims, 5 Drawing Sheets

SEMICONDUCTOR MEMORY DEVICE HAVING PAD ELECTRODES ARRANGED IN PLURAL ROWS

BACKGROUND OF THE INVENTION

1. Field of the Invention

The present invention relates to a semiconductor memory device and more particularly to a semiconductor memory device including a plurality of pad rows.

2. Description of Related Art

As a system of pad arrangement in a semiconductor memory device represented by a DRAM (Dynamic Random Access Memory), there is known a 1-row pad arrangement in which a plurality of pads are aligned in a single row at a central portion of a chip. In recent years, the number of pads arranged in a semiconductor memory device has increased due to speeding up and an increased memory capacity of semiconductor memory devices.

As a result, the chip size has increased due to an increase in the length of the pad row in the 1-row pad arrangement. To suppress the increase in the chip size resulting from an increase in the number of pads, it is preferable to use a 2-row pad arrangement as described in Japanese Patent Application Laid-open No. 2006-278805, instead of the 1-row pad arrangement.

Meanwhile, more noise interposes on a power voltage and it makes the power voltage unstable as a semiconductor memory device operates faster. However, no technique has hitherto been known that optimizes a layout of a semiconductor memory device of the 2-row pad arrangement from the viewpoint of stabilizing the power voltage.

SUMMARY

In one embodiment, there is provided a semiconductor memory device that includes a first memory cell array area and a second memory cell array area in which memory cell arrays are formed, a peripheral circuit area that is arranged between the first memory cell array area and the second memory cell array area, and in which a peripheral circuit is formed, a first pad row that is arranged between the first memory cell array area and the peripheral circuit area along a direction in which an end of the first memory cell array area extends and a second pad row that is arranged between the second memory cell array area and the peripheral circuit area along a direction in which an end of the second memory cell array area extends. The peripheral circuit is not substantially arranged between the first memory cell array area and the first pad row and between the second memory cell array area and the second pad row.

According to the present invention, because substantially no peripheral circuit is arranged between a memory cell array area and a pad row area, the memory cell array area and a pad can be connected within a shorter distance by using a low electrical resistance wiring of an upper layer. As a result, for example, even in a case where a power potential that is sensitive to noise is to be supplied to the memory cell array area, the power potential can be stably supplied from a pad. Further, because the pad row does not divide the peripheral circuit area, it is more flexible to design the peripheral circuit area.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
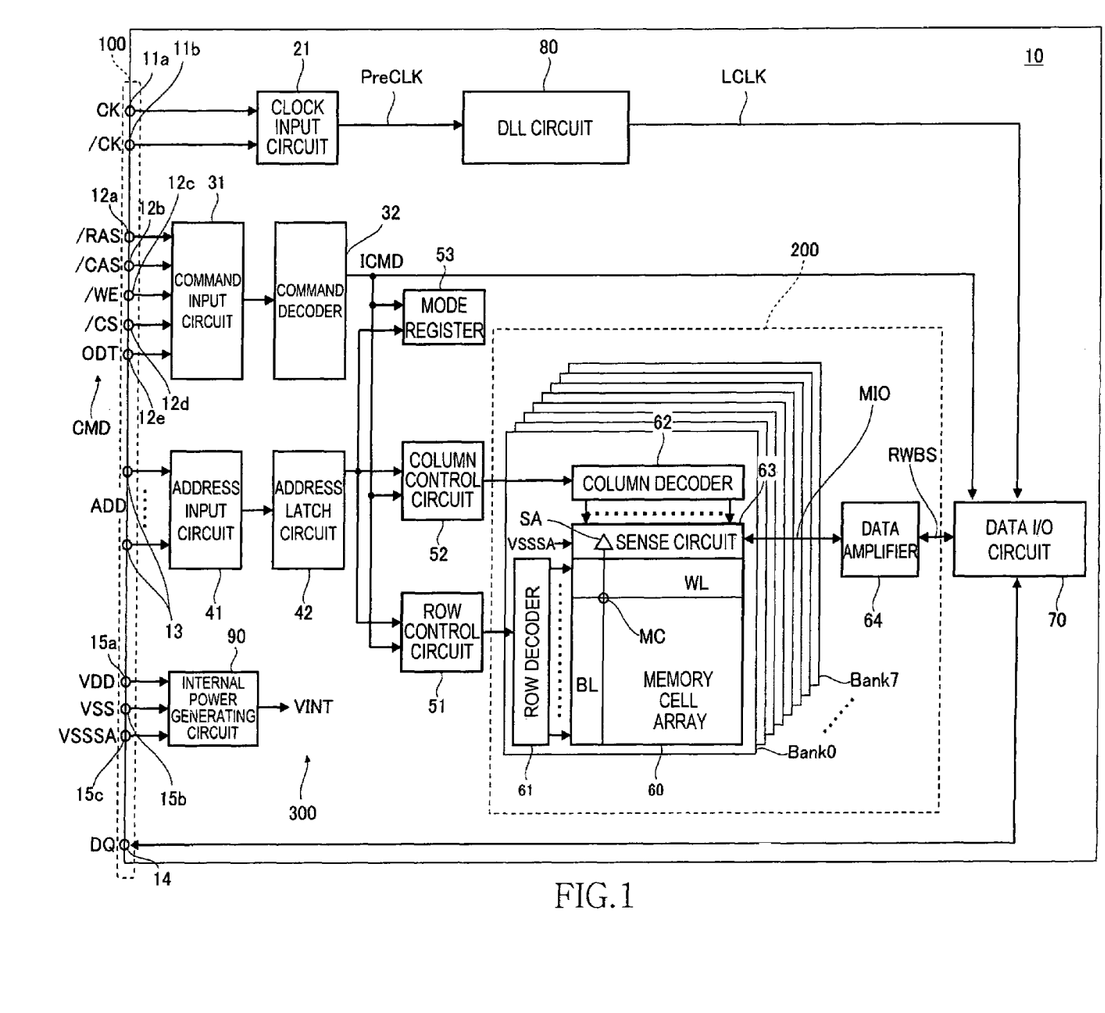
FIG. 1 is a block diagram of an overall configuration of a semiconductor memory device according to a preferred embodiment of the present invention.

FIG. 1 is a block diagram of an overall configuration of a semiconductor memory device 10 according to a preferred embodiment of the present invention.

The semiconductor memory device 10 of the first embodiment is a DDR SDRAM formed on a single semiconductor chip, and includes, as external terminals (pads), clock terminals 11a and 11b, command terminals (command pads) 12a to 12e, address terminals (address pads) 13, a data input and output (I/O) terminal (I/O pad) 14, and power terminals (power pads) 15a to 15c. In addition to these terminals, the semiconductor memory device 10 includes data strobe terminals (data strobe pads) and calibration terminals (calibration pads), but these terminals are omitted from FIG. 1. These pads 100 are arranged in two pad rows, and the actual layout thereof is described later.

The clock terminals 11a and 11b are supplied with external clock signals CK and /CK, respectively. These external clock signals CK and /CK are then supplied to a clock input circuit 21. In the present specification, a signal with a/(slash) at the beginning of the signal name means that the signal is an inverse signal or a low-active signal of a corresponding signal. Thus, the external signals CK and /CK are complementary to each other. The clock input circuit 21 generates a single phase internal clock signal PreCLK from the external clock signals CK and /CK, and supplies it to a DLL circuit 80. The DLL circuit 80 generates a phase-controlled internal clock signal LCLK from the internal clock signal PreCLK and supplies it to a data I/O circuit 70.

The command terminals 12a to 12e are supplied with a row address strobe signal /RAS, a column address strobe signal /CAS, a write enable signal /WE, a chip select signal /CS, and an on-die termination signal ODT, respectively. These command signals CMD are supplied to a command input circuit 31. The command input circuit 31 supplies the command signals CMD to a command decoder 32. The command decoder 32 generates various internal commands ICMD by performing retaining, decoding, counting or the like the command signals CMD. The internal commands ICMD are supplied to a row control circuit 51, a column control circuit 52, a mode register 53, and the data I/O circuit 70.

The address terminals 13 are supplied with an address signal ADD. The address signal ADD is then supplied to an address input circuit 41. An output of the address input circuit 41 is supplied to an address latch circuit 42. Among the address signal ADD that is latched in the address latch circuit 42, a row address is supplied to the row control circuit 51, and a column address is supplied to the column control circuit 52.

When there is an entry in a mode register set, the address signal ADD is supplied to the mode register 53. In this case, the contents of the mode register 53 are updated.

An output of the row control circuit 51 is supplied to a row decoder 61. The row decoder 61 selects one word line from among word lines WL of a memory cell array 60. A plurality of the word lines WL and a plurality of bit lines BL are arranged inside the memory cell array 60 in an intersecting manner. Memory cells MC are arranged at the nodes of the word lines WL and the bit lines BL (only one word line WL, one bit line BL, and one memory cell MC are shown in FIG. 1). Each bit line BL is connected to a corresponding one of sense amplifiers SA in a sense circuit 63.

An output of the column control circuit 52 is supplied to a column decoder 62. The column decoder 62 selects one sense amplifier from among the sense amplifiers SA in the sensing circuit 63. The sense amplifier SA selected by the column decoder 62 is connected to a data amplifier 64 via a main I/O line MIO. The data amplifier 64, on a read operation, further amplifies read data RD that has been amplified by the sense amplifier SA, and supplies the amplified read data RD to the data I/O circuit 70 via a read write bus RWBS. On the other hand, the data amplifier 64, on a write operation, amplifies write data supplied to it from the data I/O circuit 70 via the read write bus RWBS, and supplies the amplified write data to the sense amplifier SA.

The data I/O terminal 14 is provided with outputting read data DQ and inputting write data DQ. The data I/O terminal 14 is connected to the data I/O circuit 70. The internal clock LCLK generated by the DLL circuit 80 is supplied to the data I/O circuit 70. The data I/O circuit 70, on the read operation, outputs the read data DQ in synchronization with the internal clock LCLK. Although only one data I/O terminal 14 is shown in FIG. 1, the number of the data I/O terminal 14 is not necessarily one. The data I/O terminal 14 can be provided in plural.

The power terminals 15*a* to 15*c* are supplied with a corresponding power potential. Specifically, a high power potential VDD is supplied to the power terminal 15*a*, a low power potential (a ground potential) VSS is supplied to the power terminal 15*b*, and a low power potential (a ground potential) VSSSA for the sense amplifier is supplied to the power terminal 15*c*. The high power potential VDD and the low power potential VSS are supplied to an internal power generating circuit 90. The internal power generating circuit 90 generates various internal power potentials VINT. A high power potential (VARAY) for a sense amplifier, a power potential (VPERI) for a peripheral circuit, a word line potential (VPP) or the like are the examples of the internal power potentials VINT.

The overall configuration of the semiconductor memory device 10 is as described above. Among the constituent elements shown in FIG. 1, the pads 100 are arranged in two rows, array circuit portions that is included in an array circuit 200 are arranged in a memory cell areas, and other peripheral circuit portions that is included in a peripheral circuit 300 are arranged in a peripheral circuit areas. As explained above, the pads 100 are external terminals including the clock terminals 11*a* and 11*b*, the command terminals 12*a* to 12*e*, the address terminals 13, the data I/O terminal 14, and the power terminals 15*a* to 15*c*. Meanwhile, the array circuit 200 includes as the array circuit portions the memory cell array 60, the row decoder 61, the column decoder 62, the sense circuit 63, and the data amplifier 64. The peripheral circuit 300 includes as the peripheral circuit portions all the circuits other than the array system circuit portions included in the array circuit 200.

In the present embodiment, the array system circuit 200 is divided into eight banks from Bank0 to Bank7. A bank is a unit circuit to which a command can be issued independently. A bank is specified by a bank address input via the address terminals 13.

A layout of the semiconductor memory device 10 is explained next.

Figure 2:
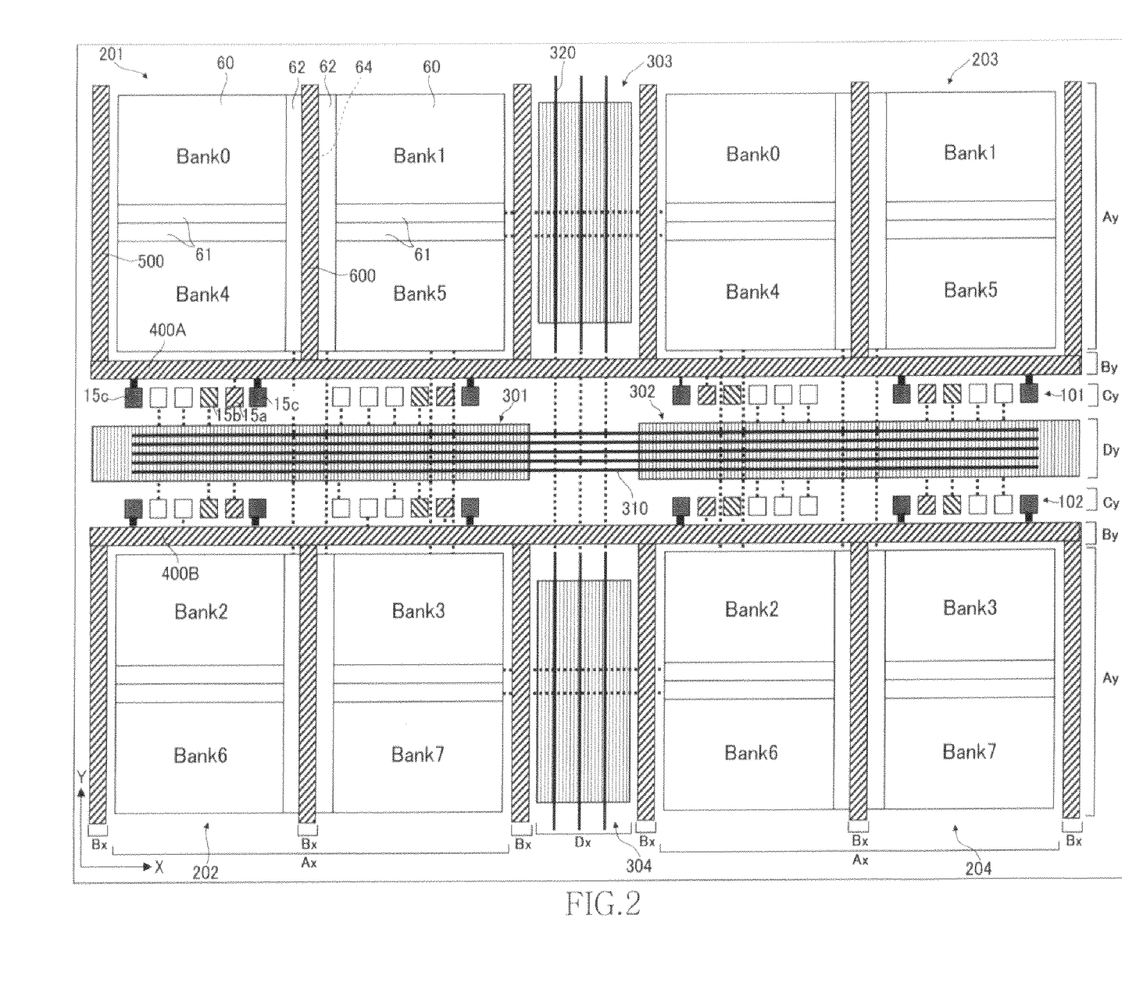
FIG. 2 is a layout diagram of the semiconductor memory device according to the first embodiment.

FIG. 2 is a layout diagram of the semiconductor memory device 10, and shows a first embodiment of the present invention.

As shown in FIG. 2, the semiconductor memory device 10 according to the first embodiment is rectangular with a long side along an X direction and a short side along a Y direction. The array circuit portions included in the array circuit 200 are separately arranged in four memory cell array areas 201 to 204 and half portions of four banks are formed in each of these areas. For example, half of the banks Bank0, Bank1, Bank4, and Bank5 are formed in the memory cell array area 201. The memory cell array areas 201 to 204 correspond to areas where areas Ax in the X direction and areas Ay in the Y direction intersect.

The peripheral circuit portions included in the peripheral circuit 300 are also divided into about four peripheral circuit areas 301 to 304. The peripheral circuit areas 301 and 302 are arranged in an area Dy in the Y direction. That is, the peripheral circuit area 301 is sandwiched between the memory cell array areas 201 and 202, and the peripheral circuit area 302 is sandwiched between the memory cell array areas 203 and 204. The peripheral circuit areas 303 and 304 are arranged in the area Dx in the X direction. Specifically, the peripheral circuit area 303 is sandwiched between the memory cell array areas 201 and 203, and the peripheral circuit area 304 is sandwiched between the memory cell array areas 202 and 204.

Although the configuration is not particularly limited, the command decoder 32 and the address latch circuit 42 are arranged in the peripheral circuit area 301, the data I/O circuit 70 and the like are arranged in the peripheral circuit area 302, and fuses and the like included in the row control circuit 51 and the column control circuit 52 are arranged in the peripheral circuit areas 303 and 304.

The pads 100 are arranged in two pad rows 101 and 102 located in respective areas Cy in the Y direction. The pad row 101 is sandwiched between the memory cell array areas 201, 203 and the peripheral circuit areas 301, 302, and the pad row 102 is sandwiched between the memory cell array areas 202, 204 and the peripheral circuit areas 301, 302. Thus, no peripheral circuit is arranged substantially between the memory cell array areas and the pad rows.

In FIG. 2, pads that are subjected to a right up slanting hatching are the power terminal 15*a* to which the power potential VDD is supplied, pads that are subjected to left up slanting hatching are the power terminal 15*b* to which the ground potential VSS is supplied, and pads filled with black are the power terminal 15*c* to which the power potential VSSSA is supplied. White pads are other external terminals. All the pads, in order to realize connections with the outside, are formed in the topmost wiring layer.

Furthermore, between the pad rows 101, 102 and the memory cell array areas 201 to 204, that is, within power trunk line areas 400A and 400B located in areas By in the Y direction, is arranged a plurality of power trunk lines that extend in the X direction. Because the power trunk lines should have a sufficiently low electrical resistance, the power trunk lines are formed in the topmost wiring layer. The reason is that, the upper a layer is, the wider the wiring width and the thicker the wiring thickness can be made. Thus, the upper a layer is, the lower the electrical resistance per unit length of the layer is.

As shown in FIG. 2, in areas Bx in the X direction, that is, on both the sides in the X direction of the memory cell array areas 201 to 204, are provided power trunk line areas 500. A plurality of power trunk lines that extend in the Y direction are arranged in the power trunk line areas 500, and each of these power trunk lines is connected to a corresponding one of the power trunk lines formed in the power trunk line areas 400A and 400B. Furthermore, a power trunk line area 600 is provided in a central part along the X direction of the memory cell array areas 201 to 204. A plurality of power trunk lines that extend in the Y direction are also arranged in the power trunk line areas 600, and each of these power trunk lines is connected to a corresponding one of the power trunk lines formed in the power trunk line areas 400A and 400B. The power trunk line areas 600 are provided in the Y direction along the data amplifier 64 (see FIG. 5A). Even the power trunk lines formed in the power trunk line areas 500 and 600 are formed in the topmost wiring layer.

Meanwhile, in the area Dy in the X direction in which the peripheral circuit areas 301 and 302 are arranged, there is arranged in the topmost wiring layer a plurality of long distance wirings 310 that extend in the X direction. Moreover, in the area Dx in the Y direction in which the peripheral circuit areas 303 and 304 are arranged, there is arranged in the topmost wiring layer a plurality of long distance wirings 320 that extend in the Y direction. Each long distance wiring 310 is a signal line or a power line. Each long distance wiring 320 is also a signal line or a power line. Thus, a wiring that crosses these long distance wirings 310 and 320 cannot be formed in the topmost wiring layer. To cross the long distance wirings 310 and 320, it is necessary to once bypass to a lower wiring layer via a through hole electrode. As a result, an electrical resistance of a wiring that extends in a direction that crosses the peripheral circuit areas 301 to 304 tends to be higher than an electrical resistance of a wiring in the topmost wiring layer. The wirings shown with dashed lines in FIG. 2 are wirings formed in a wiring layer second from the top or lower.

Figure 3:
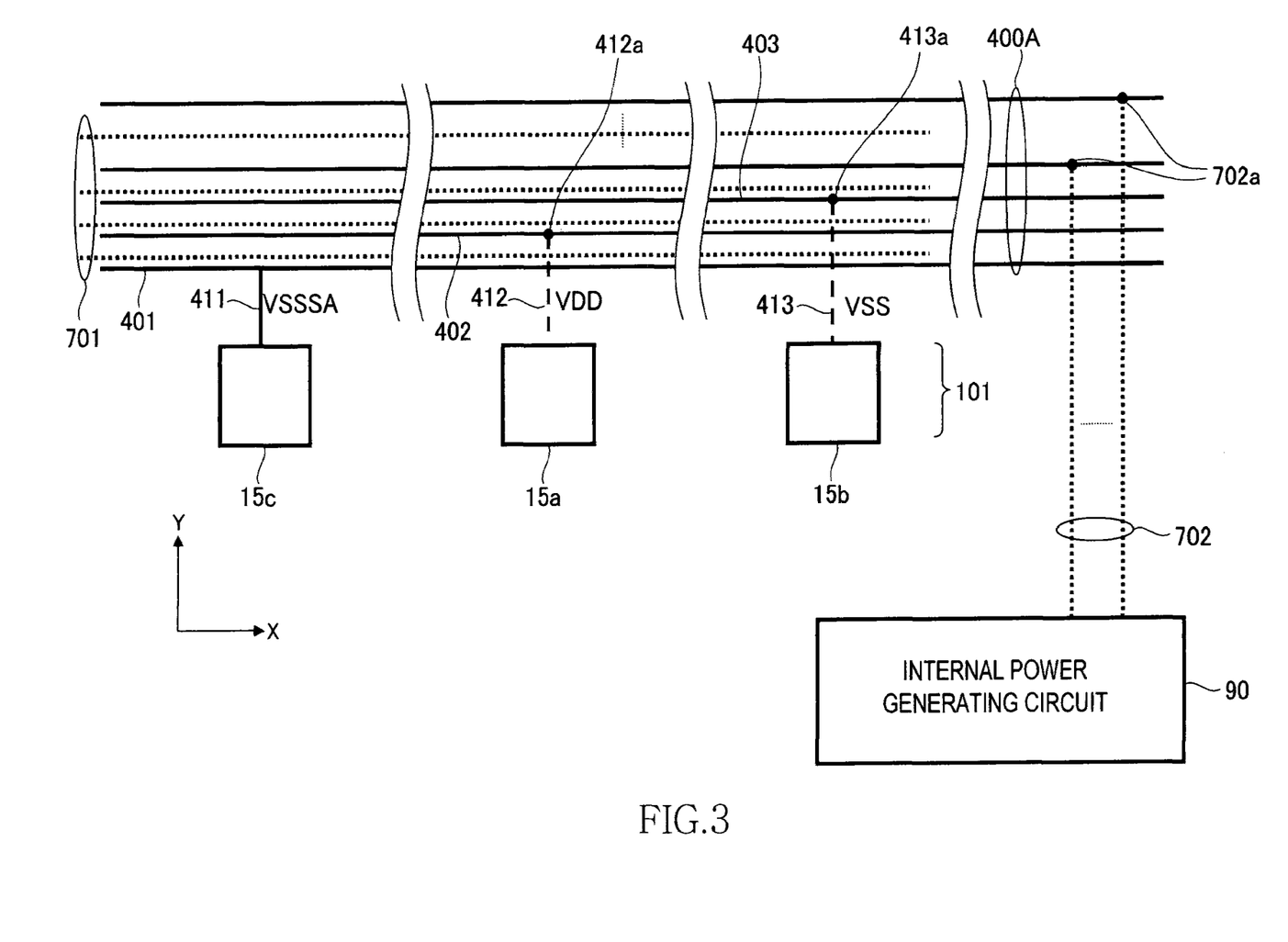
FIG. 3 is a schematic enlarged view for explaining a connection relation between the power terminals and the power trunk lines.

FIG. 3 is a schematic enlarged view for explaining a connection relation between the power terminals 15a to 15c and the power trunk lines.

As shown in FIG. 3, among the pads arranged in the pad row 101, the power terminal 15c to which the ground potential VSSSA for the sense amplifier is supplied is directly connected to a power trunk line 401 provided in the power trunk line area 400A. Thus, each of the power terminal 15c and the power trunk line 401 is formed in the topmost wiring layer, and they are directly connected to each other via a lead wiring 411 formed in the topmost wiring layer. That is, the power terminal 15c and the power trunk line 401 are connected to each other without passing through a lower wiring layer and a through hole electrode.

Meanwhile, the power terminal 15a to which the power potential VDD is supplied and the power terminal 15b to which the ground potential VSS is supplied are connected to power trunk lines 402 and 403, respectively, via lead wirings 412 and 413 provided in the lower wiring layer and through holes 412a and 413a. It is preferable that the lead wirings 412 and 413 be formed in a wiring layer second from the top or lower. The reason is that, the wiring layer second from the top or lower has the second lowest electrical resistance wiring after the topmost wiring layer. In such a configuration, it becomes necessary to form other wirings 701, which are arranged in a lower layer in the power trunk line area 400A, in a wiring layer third from the top or lower. A wiring used for connecting to a decoupling capacitor provided on a semiconductor substrate in the power trunk line area 400A and the like are examples of the wirings 701.

Moreover, the power trunk lines provided in the power trunk line area 400A are connected to the internal power generating circuit 90 via through hole electrodes 702a and wirings 702. The wirings 702 extend in the Y direction and they are formed in the same wiring layer as the wirings 701.

The connection relation between the pad row 101 and the power trunk lines is explained above. A connection relation between the pad row 102 and the power trunk lines is similar to this.

In this manner, in the semiconductor memory device 10 according to the first embodiment, no peripheral circuit is arranged substantially between the memory cell array areas 201, 203 and the pad row 101, or between the memory cell array areas 202, 204 and the pad row 102. Therefore, because the lead wiring that connects the power trunk line areas 400A, 400B and the pad rows 101, 102 does not straddle the peripheral circuit areas 301 and 302, the two can be connected within a shorter distance by using the upper wiring layer that has a lower electrical resistance.

Particularly, because the power terminal 15c to which the ground potential VSSSA for the sense amplifier is supplied is directly connected to the power trunk line 401 without going through the lower wiring layer, its parasitic electrical resistance component can be suppressed to the minimum. As a result, even if the power voltage varies due to the operation of the sense amplifier SA, because the time required for the voltage to stabilize can be shortened, the operation of the sense amplifier SA that is very sensitive to power noise can be stabilized.

A second embodiment of the present invention is explained next.

Figure 4:
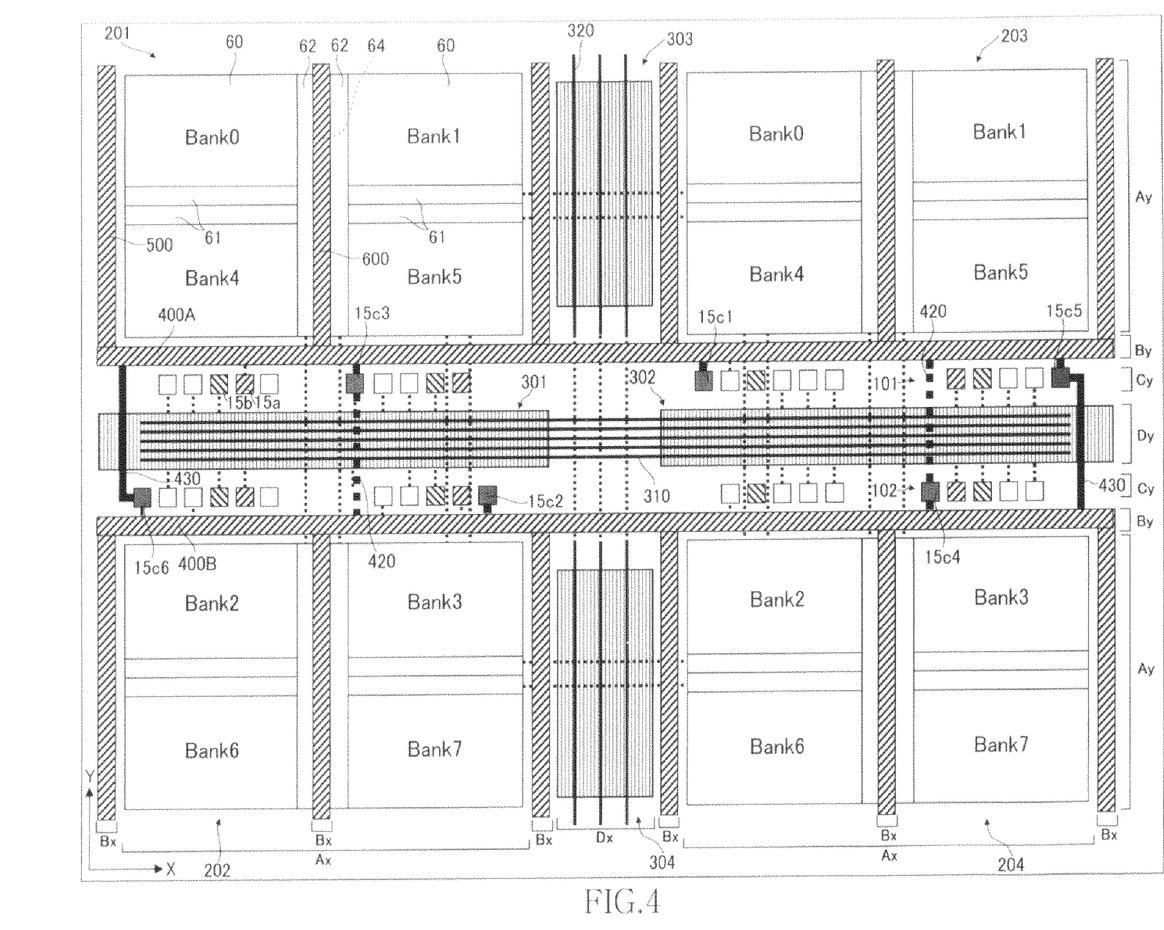
FIG. 4 is a layout diagram of the second embodiment.

FIG. 4 is a layout diagram of the second embodiment.

In the layout shown in FIG. 4, in order to reduce the number of pads, the number of the power terminals 15c is reduced by half as compared to the layout shown in FIG. 2. Among the power terminals 15c, power terminals 15c1 and 15c2 are directly connected to the power trunk lines in the same manner as in the first embodiment.

Meanwhile, power terminals 15c3 and 15c4 are not only directly connected to the adjacent power trunk lines, but they are also connected to the power trunk lines on the opposite side. Specifically, the power terminal 15c3 is directly connected to the power trunk line formed in the power trunk line area 400A, and it is also connected to the power trunk line formed in the power trunk line area 400B via a lead wiring 420 that passes through a lower wiring layer. Similarly, the power terminal 15c4 is directly connected to the power trunk line formed in the power trunk line area 400B, and it is also connected to the power trunk line formed in the power trunk line area 400A via the lead wiring 420 that passes through the lower wiring layer. It is preferable that the lead wiring 420 be provided in a wiring layer second from the top or lower. Moreover, it is preferable that the lead wiring 420 be wider than any other wiring formed in the same wiring layer. This makes it possible to reduce a parasitic electrical resistance component due to the lead wiring 420.

Furthermore, power terminals 15c5 and 15c6 are not only directly connected to the power trunk lines that are near to them, but they are also directly connected to the power trunk lines on the opposite side. Specifically, the power terminal 15c5 is directly connected to the power trunk line formed in the power trunk line area 400A, and it is also directly connected to the power trunk line formed in the power trunk line area 400B via a lead wiring 430. Similarly, the power terminal 15c6 is directly connected to the power trunk line formed in the power trunk line area 400B, and it is also directly connected to the power trunk line formed in the power trunk line area 400A via the lead wiring 430. The lead wiring 430 is formed in the topmost wiring layer in the same manner as the power trunk lines formed in the power trunk line areas 400A and 400B. This makes it possible to reduce a parasitic electrical resistance component due to the lead wiring 430. In addition, no through hole is used.

While the lead wiring 430 extends in the Y direction and, because the long distance wirings 310 that extend in the X direction are formed in the peripheral circuit areas 301 and 302, the lead wiring 430 cannot be arranged at a location where there can take place interference with the long distance wirings 310. Therefore, in the second embodiment, the interference with the long distance wirings 310 is avoided by connecting the lead wiring 430 to the power terminals 15c5 and 15c6 positioned at the far ends.

In this manner, when it is necessary to reduce the number of power terminals due to a restriction on the number of pads, by providing a path by connecting the lead wirings 420 and 430 to the power trunk line on the opposite sides, the power supply to the memory cell array areas 201 to 204 can be stabilized. In the second embodiment, because the power terminals 15c are arranged in a zigzag pattern, a properly balanced power can be supplied to the memory cell array areas 201 to 204.

It is apparent that the present invention is not limited to the above embodiments, but may be modified and changed without departing from the scope and spirit of the invention.

Figure 5A:
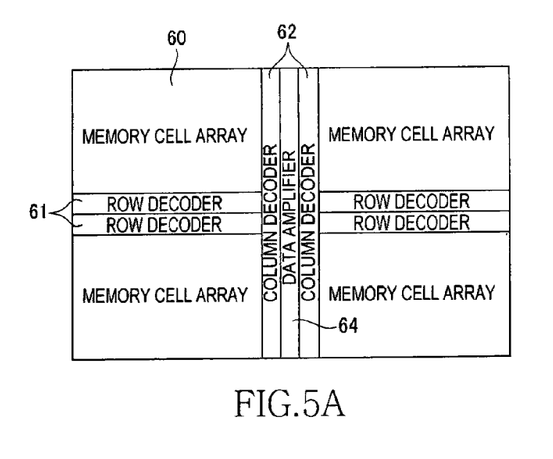
FIGS. 5A to 5C are other layout diagrams of the memory cell array.
Figure 5B:
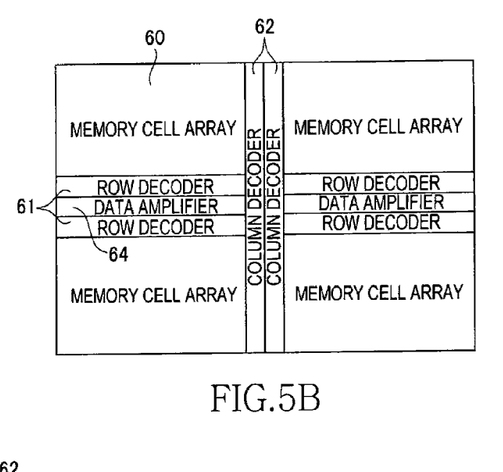
Figure 5C:
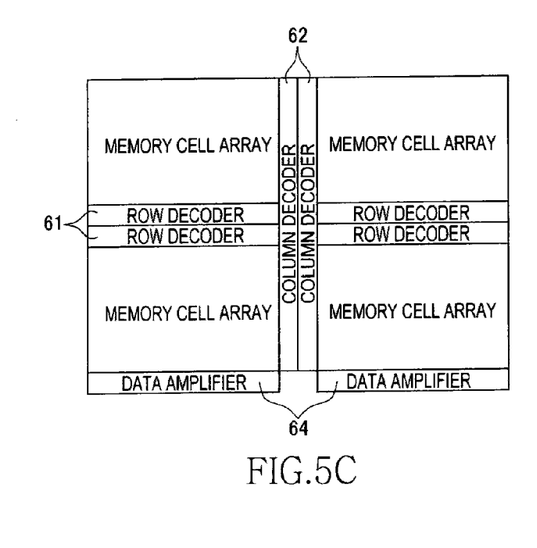

For example, the layout of the memory cell array areas 201 to 204 is not limited to those explained above, and various other layouts can be also employed. That is, the layout is not limited to those described in the above embodiments (FIG. 5A) and any one of the layouts shown in FIGS. 5B and 5C can be employed. FIG. 5B shows an example of a layout in which the data amplifier 64 is arranged between the row decoders 61, and FIG. 5O shows an example of a layout in which the data amplifier 64 is arranged along an end of the memory cell array 60. In the layouts shown in FIGS. 5B and 5C, the data amplifier 64 is arranged in an area that has the X direction as a long direction. Further, in the layout shown in FIG. 5C, the data amplifier 64 needs to be arranged at an end of the memory cell array areas 201 to 204. In any of these layouts, the sense circuit 63 is distributed in the memory cell array 60.

What is claimed is:

1. A semiconductor memory device comprising:
a first memory cell array area and a second memory cell array area in which memory cell arrays are formed;
a peripheral circuit area that is arranged between the first memory cell array area and the second memory cell array area, and in which a peripheral circuit is formed;
a first pad row that is arranged between the first memory cell array area and the peripheral circuit area along a first direction in which an end of the first memory cell array area extends;
a second pad row that is arranged between the second memory cell array area and the peripheral circuit area along a second direction in which an end of the second memory cell array area extends;
a first trunk area that is arranged between the first memory cell array area and the first pad row along the first direction;
a second trunk area that is arranged between the second memory cell array area and the second pad row along the second direction;
a first lead wiring that connects a first pad included in the first pad row to a first trunk arranged in the first trunk area without using a through hole electrode; and
a second lead wiring that connects a second pad included in the second pad row to a second trunk arranged in the second trunk area without using a through hole electrode,
wherein the peripheral circuit is not substantially arranged between the first memory cell array area and the first pad row and between the second memory cell array area and the second pad row.

2. The semiconductor memory device as claimed in claim 1, wherein a power trunk line to which a power potential is supplied is arranged in the first and second trunk areas.

3. The semiconductor memory device as claimed in claim 1, wherein sense amplifiers are further formed in each of the first and second memory cell array areas.

4. The semiconductor memory device as claimed in claim 3, wherein power potentials for the sense amplifiers are supplied to the first and second pads.

5. The semiconductor memory device as claimed in claim 4, wherein a data amplifier connected to the sense amplifiers are further formed in each of the first and second memory cell array areas.

6. The semiconductor memory device as claimed in claim 1, further comprising a third lead wiring that connects a third pad included in the first pad row to a third trunk arranged in the second trunk area without using a through hole electrode.

7. The semiconductor memory device as claimed in claim 6, wherein the third pad is located at an end of the first pad row.

8. The semiconductor memory device as claimed in claim 6, further comprising a fourth lead wiring that connects a fourth pad included in the second pad row to a fourth trunk arranged in the first trunk area without using a through hole electrode.

9. The semiconductor memory device as claimed in claim 8, wherein the fourth pad is located at an end of the second pad row.

10. The semiconductor memory device as claimed in claim 1, further comprising a fifth lead wiring that connects a fifth pad included in the first pad row to a fifth trunk arranged in the second trunk area using a through hole electrode.

11. The semiconductor memory device as claimed in claim 10, further comprising a sixth lead wiring that connects a sixth pad included in the second pad row to a sixth trunk arranged in the first trunk area using a through hole electrode.

12. A device comprising:
first and second memory cell array areas;
a peripheral circuit area arranged between the first and second memory cell array areas;
a first pad row arranged between the first memory cell array area and the peripheral circuit area and comprising a plurality of first pads;
a first trunk line disposed between the first memory cell array area and the first pad row and elongated along the first pad row; and
a first lead wiring extending straightly from one of the first pads on a side opposite to the peripheral circuit area and reaching to the first trunk line.

13. The device as claimed in claim 12, wherein the first and second memory cell array areas, the peripheral areas and the first pad row are arranged in a first direction and the first lead wiring extends in the first direction.

14. The device as claimed in claim 12, wherein the first memory cell array area includes a plurality of first array circuits that operate on a first voltage, the one of the first pads is externally supplied with the first voltage, and the first lead wiring and the first trunk line convey from the one of the first pads the first voltage to the first memory cell array area.

15. The device as claimed in claim 14, wherein each of the first array circuits of the first memory cell array area comprises a sense amplifier.

16. The device as claimed in claim 12, wherein the peripheral circuit area includes a plurality of peripheral circuits and the first memory cell array area and the first pad row are arranged without an intervention of any one of the peripheral circuits therebetween.

17. A device comprising:
 a memory cell array area;
 a peripheral circuit area including a first peripheral circuit;
 a multi-level wiring structure including a lower-level wiring layer and an upper-level wiring layer;
 a pad row arranged between the memory cell array area and the peripheral circuit area and comprising a plurality of pads including first and second pads, each of the pads being provided as the upper-level wiring layer;
 a first trunk line disposed between the memory cell array area and the pad row and elongated along the pad row, the first trunk line being provided as the upper-level wiring layer;
 a first lead wiring provided as the upper-level wiring layer and connecting the first pad to the first trunk line without passing through the lower level wiring layer; and
 a second lead wiring provided as the lower-level wiring layer and connecting the second pad to the peripheral circuit of the peripheral circuit area.

18. The device as claimed in claim 17, wherein the pads of the pad row further includes a third pad, and the device further comprises;
 a second truck line disposed between the memory cell array area and the first trunk line and extending in parallel to the first trunk line, and
 a third lead wiring provided as the lower-level wiring layer and connecting the third pad to the second trunk line.

19. The device as claimed in claim 17, wherein the first memory cell array area includes a plurality of first array circuits that operate on a first voltage, the one of the first pads is externally supplied with the first voltage, and the first lead wiring and the first trunk line convey the first voltage to the first memory cell array area.

20. The device as claimed in claim 17, wherein the peripheral circuit area includes a plurality of second peripheral circuits and the memory cell array area and the pad row are arranged without an intervention of any one of the first and second peripheral circuits therebetween.

* * * * *